(12) United States Patent
Min et al.

(10) Patent No.: US 11,287,478 B2
(45) Date of Patent: Mar. 29, 2022

(54) METHOD AND APPARATUS FOR DETECTING DAMAGE OF BATTERY SEPARATOR

(71) Applicant: LG CHEM, LTD., Seoul (KR)

(72) Inventors: Hoon Min, Daejeon (KR); Chan-Woo Park, Daejeon (KR); Byung-Soo Kim, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 0 days.

(21) Appl. No.: 16/959,198

(22) PCT Filed: Apr. 11, 2019

(86) PCT No.: PCT/KR2019/004380
§ 371 (c)(1),
(2) Date: Jun. 30, 2020

(87) PCT Pub. No.: WO2020/032343
PCT Pub. Date: Feb. 13, 2020

(65) Prior Publication Data
US 2020/0400747 A1 Dec. 24, 2020

(30) Foreign Application Priority Data
Aug. 9, 2018 (KR) .................. 10-2018-0093225

(51) Int. Cl.
G01R 31/36 (2020.01)
H01M 10/42 (2006.01)
H01M 50/40 (2021.01)
(52) U.S. Cl.
CPC ........ G01R 31/36 (2013.01); H01M 10/4285 (2013.01); H01M 50/40 (2021.01)

(58) Field of Classification Search
None
See application file for complete search history.

(56) References Cited

U.S. PATENT DOCUMENTS

2001/0019270 A1 9/2001 Onishi et al.
2010/0261065 A1* 10/2010 Babinec ............ H01M 10/0525
429/246

FOREIGN PATENT DOCUMENTS

JP 2004-006420 A 1/2004
JP 3677993 B2 8/2005
(Continued)

OTHER PUBLICATIONS

Nagamatsu Shigetaka; Inspection Method of Wound Electrode Body, and Inspection Device of Wound Electrode Body; Date of publication of application: Mar. 5, 2009; Toyota Motor Corp; JP,2009-048971,A; (Year: 2009).*

(Continued)

Primary Examiner — Nasima Monsur
(74) Attorney, Agent, or Firm — Morgan, Lewis & Bockius LLP

(57) ABSTRACT

A separator damage detecting apparatus detects a separator damage of a secondary battery by applying a voltage while pressing an electrode assembly having a structure in which a positive electrode plate, a separator and a negative electrode plate are stacked, to induce a temporary short circuit of a positive electrode plate and a negative electrode plate. The separator damage detecting apparatus includes a short circuit measuring unit configured to apply a voltage to the electrode assembly and detect a leakage current; and a pressing jig configured to roll-press at least one surface of the electrode assembly or consecutively press predetermined regions of the at least one surface of the electrode assembly.

11 Claims, 5 Drawing Sheets

(56) References Cited

FOREIGN PATENT DOCUMENTS

| JP | 2009-093797 A | 4/2009 |
|---|---|---|
| JP | 2010-032346 A | 2/2010 |
| JP | 2010-034001 A | 2/2010 |
| JP | 4666712 B2 | 4/2011 |
| JP | 4993196 B2 | 8/2012 |
| KR | 10-0965540 B1 | 6/2010 |
| KR | 10-2011-0021970 A | 3/2011 |
| KR | 10-2014-0138383 A | 12/2014 |
| KR | 10-2016-0068244 A | 6/2016 |
| KR | 10-1790118 B1 | 10/2017 |
| KR | 10-1800051 B1 | 11/2017 |

OTHER PUBLICATIONS

Cho HyoupJe; Fixation Device for Checking Defect of Electrode Assembly and Method of Checking the Same; LG Chem, Ltd.; KR10-2014-0138383 A; Published Date Oct. 7, 2015; (Year: 2015).*
Extended European Search Report issued by the European Patent Office dated Apr. 1, 2021 in a corresponding European Patent Application No. 19848734.0.
International Search Report (with partial translation) and Written Opinion issued in corresponding International Patent Application No. PCT/KR2019/004380, dated Jul. 30, 2019.

* cited by examiner

1

METHOD AND APPARATUS FOR DETECTING DAMAGE OF BATTERY SEPARATOR

TECHNICAL FIELD

The present disclosure relates to a battery separator damage detecting apparatus and method, and more particularly, to a separator damage detecting apparatus capable of detecting a separator damage and a damage position by temporarily inducing a short circuit between electrodes in a pressing manner and applying a voltage, and a separator damage detecting method using the apparatus.

The present application claims priority to Korean Patent Application No. 10-2018-0093225 filed on Aug. 9, 2018 in the Republic of Korea, the disclosures of which are incorporated herein by reference.

BACKGROUND ART

Recently, the demand for secondary batteries is rapidly increasing as an environmentally friendly energy source. Among the secondary batteries, lithium secondary batteries exhibiting high energy density and operating potential, long cycle life and low self-discharge rate are being widely commercially used.

The lithium secondary battery includes an electrode assembly in which a positive electrode plate and a negative electrode plate respectively coated with a positive electrode active material and a negative electrode active material are disposed with a separator being interposed therebetween, and an exterior, namely a battery case, for sealing and accommodating the electrode assembly together with an electrolyte.

The electrode assembly having a structure including a positive electrode, a separator and a negative electrode structure, which is employed at the lithium secondary battery, may be briefly classified into a jelly-roll type (a rolled type), a stack type (a stacked type), and a stack/fold type that is a combination thereof, depending on the structure.

The jelly-roll type electrode assembly is prepared by coating a metal foil used as a current collector with an electrode active material or the like, drying and pressing the metal foil, then cutting the metal foil into a band form of a desired width and length, separating a negative electrode and a positive electrode using a separator, and then rolling them into a spiral shape. The jelly-roll type electrode assembly is suitable for cylindrical cells. The stack type electrode assembly has a structure in which a plurality of positive electrode units and negative electrode units are stacked in order, and it is easy to obtain a rectangular shape. The stack/fold type electrode assembly is prepared by folding a full cell having a structure of a positive electrode, a separator and a negative electrode of a unit size or a bi-cell having a structure of a positive electrode, a separator, a negative electrode, a separator and a positive electrode by using a continuous separator film of a long length.

The electrode assembly prepared as above is sealed and accommodated in the exterior together with the electrolyte after undergoing a defect inspection process. As an example of a conventional electrode assembly defect determining method, there is a method of measuring a leakage current amount flowing through an electrode assembly by applying a high voltage to a positive electrode and a negative electrode using a Hi-pot test device 6.

For example, as shown in FIG. 1, when a voltage is applied, if a separator 4 between a positive electrode plate 3 and a negative electrode plate 5 is damaged (torn or folded), an arc may be generated at the damage portion (an air layer) and a leakage current may be detected. At this time, if the leakage current exceeds a normal range, the separator is determined as being damaged and thus defective. If abnormality of the separator is detected before the process of packaging the electrode assembly in the battery case or the process of activating after the electrode assembly is packaged, the loss caused by an additional process may be reduced.

Meanwhile, when checking a separator damage, since a dielectric breakdown voltage is theoretically higher than a gas dielectric breakdown voltage, a voltage lower than the dielectric breakdown voltage of the separator is applied. However, if too low voltage is applied, the separator defect detection ability is deteriorated. Also, if a voltage higher than a proper level is applied, a normal separator portion suffers from dielectric breakdown, which may determine a good product as being defective. As a countermeasure, it is possible to induce a temporary short circuit of the positive electrode plate and the negative electrode plate by lowering the voltage and pressing the electrode assembly using a plate-shaped pressing plate so that the distance between the positive electrode plate and the negative electrode plate becomes as small as possible.

However, in the conventional method of applying the electrode assembly and simultaneously applying a surface pressure to the electrode assembly, the detection reliability may be deteriorated even though a proper voltage is applied because the pressure applied to cell unit areas varies depending on the flatness of the pressure plate or the like.

In addition, when detecting the separator defect, if the position of the separator damage portion is known, the position of the separator may be utilized as useful data for identifying the cause of the defect and improving the defect later. However, the separator damage detecting device or method merely determines whether the separator is damaged or not.

DISCLOSURE

Technical Problem

The present disclosure is designed to solve the problems of the related art, and therefore the present disclosure is directed to providing a separator damage detecting apparatus, which may enhance separator defect detecting ability with a low voltage in comparison to the conventional art and identify a damage position along with the presence of a separator damage, and a separator damage detecting method using the apparatus.

However, the technical problem to be solved by the present disclosure is not limited to the above-described problem, and other problems not mentioned herein will be clearly understood by those skilled in the art from the following description.

Technical Solution

In one aspect of the present disclosure, there is provided a separator damage detecting apparatus, which detects a separator damage of a secondary battery by applying a voltage while pressing an electrode assembly having a structure in which a positive electrode plate, a separator and a negative electrode plate are stacked, to induce a temporary short circuit of a positive electrode plate and a negative electrode plate, the separator damage detecting apparatus comprising: a short circuit measuring unit configured to apply a voltage to the electrode assembly and detect a leakage current; and a pressing jig configured to roll-press at least one surface of the electrode assembly or consecutively press predetermined regions of the at least one surface of the electrode assembly.

The pressing jig may include a first roller configured to roll-press the at least one surface of the electrode assembly with a uniform pressure from one edge of the electrode assembly to another edge opposite thereto in a horizontal direction.

The pressing jig may further include a second roller configured to roll-press the at least one surface of the electrode assembly in a direction intersecting with the rolling direction of the first roller.

The separator damage detecting apparatus may further comprise a defect position calculating unit configured to calculate a separator damage position based on moving speeds of the first roller and the second roller when the first roller and the second roller perform roll-pressing and a leakage current detection time detected by the short circuit measuring unit.

The pressing jig may include a plurality of partial pressing plates configured to independently press different regions of the at least one surface of the electrode assembly in a direction orthogonal to the one surface of the electrode assembly, and the plurality of partial pressing plates may consecutively or selectively press both edge regions and a central region of the electrode assembly.

The plurality of partial pressing plates may include edge pressing plates corresponding to both edge regions of the electrode assembly and a center pressing plate corresponding to the central region of the electrode assembly.

The edge pressing plates may include a first edge pressing plate corresponding to a central portion in the edge region of the electrode assembly; and a second edge pressing plate corresponding to a corner portion in the edge region of the electrode assembly.

In another aspect of the present disclosure, there is also provided a method for detecting a separator damage of a secondary battery, comprising: (a) preparing an electrode assembly having a structure in which a positive electrode plate, a separator and a negative electrode plate are stacked; (b) connecting a short circuit measuring unit to the electrode assembly; and (c) applying a preset voltage to the electrode assembly and detecting a leakage current while pressing at least one surface of the electrode assembly, wherein in the step (c), the at least one surface of the electrode assembly is roll-pressed using a roll, or predesignated regions of the at least one surface of the electrode assembly are consecutively or selectively pressed.

In the step (c), the electrode assembly may be roll-pressed two times, one in each of horizontal and vertical directions, with a uniform pressure from one edge of the electrode assembly to another edge opposite thereto.

The method for detecting a separator damage of a secondary battery may further comprise (d) calculating a separator damage position based on a moving speed of the roller and a leakage current detection time detected by the short circuit measuring unit, when the electrode assembly is roll-pressed two times.

Advantageous Effects

According to an embodiment of the present disclosure, the pressure applied per unit cell area is uniformly increased by roll-pressing or partial pressing instead of the conventional surface pressing, it is possible to improve separator defect detection ability even with a low voltage.

In addition, since a separator damage position is detected using the moving speed of the roller and the separator defect detection time, it is possible to contribute to eliminating the separator defect cause later.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

A separator damage detecting apparatus 1 according to the present disclosure described later may be used for detecting a damage of a separator in a full cell having a structure of a positive electrode, a separator and a negative electrode of a unit size, a bi-cell having a structure of a positive electrode, a separator, a negative electrode, a separator and a positive electrode, or an electrode assembly 2 configured by repeatedly stacking full cells or bi-cells. Namely, the separator damage detecting apparatus 1 according to the present disclosure is directed to detecting a defect of the electrode assembly 2 during a process of assembling a pouch-type secondary battery.

However, the scope of the present disclosure is not necessarily limited thereto. The separator damage detecting apparatus 1 may be utilized to inspect a separator damage of a secondary battery after the assembling process, for example before/after a formation process or before/after an aging process.

Figure 1:
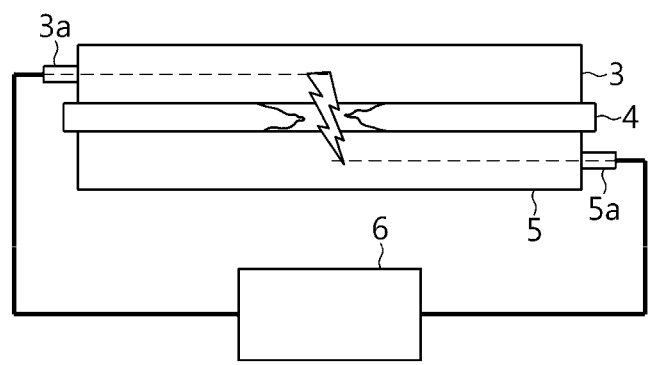
FIG. 1 is a diagram for illustrating a conventional separator defect detecting method.
Figure 2:
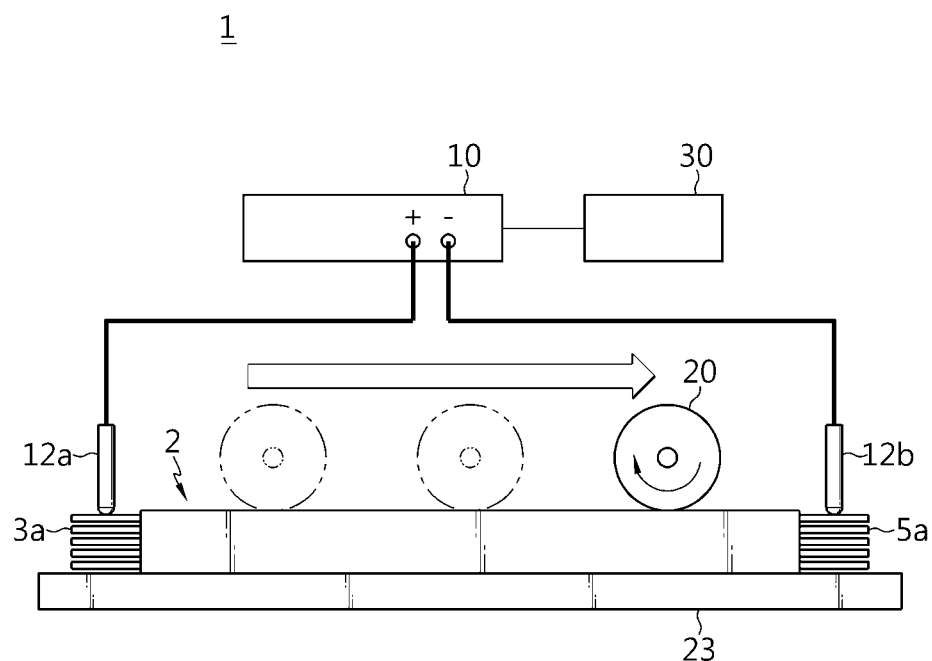
FIG. 2 is a diagram showing a separator damage detecting apparatus according to an embodiment of the present disclosure.

FIG. 2 is a diagram showing a separator damage detecting apparatus 1 according to an embodiment of the present disclosure.

Referring to FIG. 2, the separator damage detecting apparatus 1 includes a short circuit measuring unit 10 for applying a preset voltage to the electrode assembly 2 and detecting a leakage current, a pressing jig 20 for roll-pressing the electrode assembly 2, and a defect position calculating unit 30.

The short circuit measuring unit 10 is a component for applying a constant voltage to an insulating material and measuring a leakage current or an insulation resistance to determine whether the insulating material is insulated. As the short circuit measuring unit 10, an insulation resistance meter or a Hi-Pot test device may be employed.

The short circuit measuring unit 10 is connected to the electrode assembly 2 by contacting a +pin 12a with a positive electrode tab 3a of a positive electrode plate and contacting a −pin 12b with a negative electrode tab 5a of a negative electrode plate before the pressing jig 20 is used.

The insulating material maintains its insulation up to a certain voltage, but when the voltage increases further, the insulating material loses its insulation and causes dielectric breakdown. At this time, the voltage of the insulating material is called a dielectric breakdown voltage. In general, gas has a lower dielectric breakdown voltage than solid.

Thus, a separator damage portion (an air layer) at which the positive electrode plate and the negative electrode plate directly face each other with the air layer being interposed therebetween due to tearing or perforation of the separator has a lower dielectric breakdown voltage than normal portions. In other words, particularly, the risk of short circuit of the positive electrode plate and the negative electrode plate is high at the separator damage portion.

In consideration of this, the separator damage detecting apparatus 1 according to an embodiment of the present disclosure is configured to increase the detecting ability for a defect separator while reducing the risk during the separator inspection process. Namely, the separator damage detecting apparatus 1 presses the electrode assembly 2 in a roll-pressing manner to induce a temporary short circuit between the positive electrode plate and the negative electrode plate at the separator damage portion D so that the separator damage D may be detected even though a low voltage is applied.

For example, as shown in FIG. 2, the electrode assembly 2 is roll-pressed using the pressing jig 20 to make the distances among the positive electrode plate, the separator and the negative electrode plate as small as possible sequentially along the rolling direction, and in this state, a low voltage is applied to determine a defect separator based on whether there is a short circuit between the positive electrode plate and the negative electrode plate.

As the pressing jig 20, a cylindrical roller may be employed. The roller-type pressing jig 20 may press a site in contact with an upper surface and/or a lower surface of the electrode assembly 2 while rolling. Thus, the pressure applied to a unit cell area may be increased with the same force compared to the conventional jig using a surface pressing method, which is more advantageous in causing a temporary short circuit of the separator damage portion.

Figure 3:
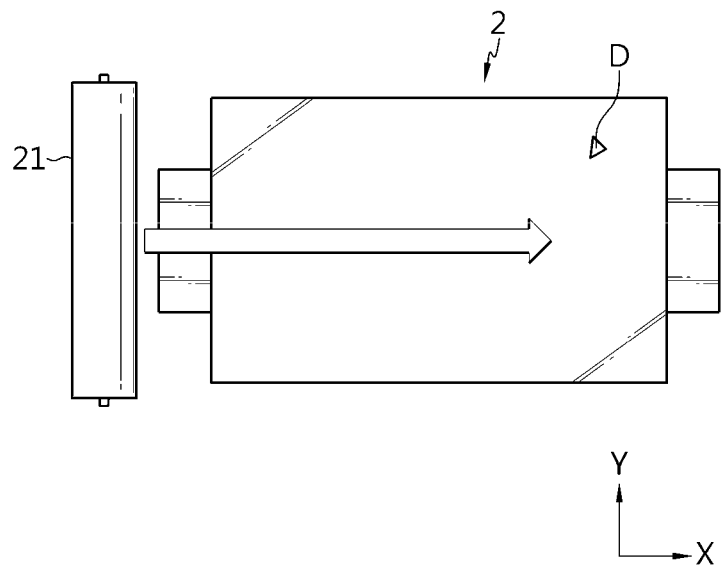
FIGS. 3 and 4 are diagrams for illustrating a roll-pressing method using a roller according to an embodiment of the present disclosure.
Figure 4:
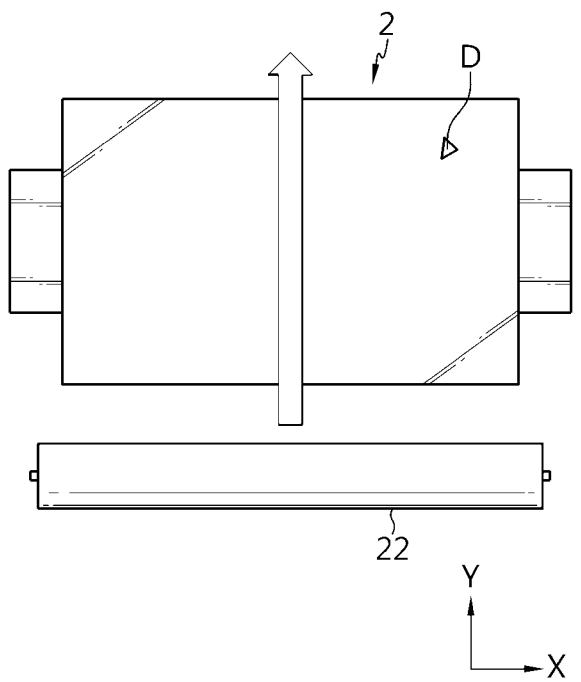

FIGS. 3 and 4 are diagrams for illustrating a roll-pressing method using a roller according to an embodiment of the present disclosure.

More specifically, referring to FIGS. 3 and 4, the pressing jig 20 according to an embodiment of the present disclosure includes a first roller 21 and a second roller 22.

The first roller 21 has a length corresponding to the width of the electrode assembly 2, and the second roller 22 has a length corresponding to the length of the electrode assembly 2. Thus, the first roller 21 and the second roller 22 may be provided to roll-press the entire area of one surface of the electrode assembly 2 in the horizontal or vertical direction.

For example, as shown in FIG. 3, the first roller 21 is provided to roll-press the upper surface of the electrode assembly 2 with a preset pressure from one edge of the electrode assembly 2 to another edge opposite thereto in the horizontal direction. In this embodiment, the lower surface of the electrode assembly 2 is placed on a worktable 23 of a surface plate, and the electrode assembly 2 is roll-pressed using one first roller 21. However, in a modified embodiment, the upper surface and the lower surface of the electrode assembly 2 may also be roll-pressed using two first rollers 21 simultaneously.

Since the first roller 21 performs roll-pressing as above, the positive electrode plate, the separator and the negative electrode plate of the electrode assembly 2 are compressed so that the distances among are consecutively decreased along the rolling direction of the first roller 21. Thus, when the first roller 21 rolls on the damaged position D of the separator in a state where the preset voltage is applied, a short circuit between the positive electrode plate and the negative electrode plate is easily induced at the corresponding position to detect the leakage current. Here, when the first roller 21 rolls on a portion without a separator damage, the insulation of the separator is maintained as it is since a low voltage is applied, and thus a leakage current is not detected.

Meanwhile, the separator damage detecting apparatus 1 according to the present disclosure may further include a second roller 22 to increase the reliability of the separator inspection and more accurately identify the separator damage position D.

As shown in FIG. 4, the second roller 22 is provided to roll-press the upper surface of the electrode assembly 2 with a preset pressure from one edge of the electrode assembly 2 to another edge opposite thereto in a direction intersecting with the rolling direction of the first roller 21, namely in a vertical direction (+Y-axis direction).

In this way, the detection power may be increased by applying a voltage and roll-pressing the electrode assembly 2 two times by using the first and second rollers 21, 22 to identify a separator damage again. That is, even if a leakage current is not detected during the roll-pressing process by the first roller 21, a leakage current may be detected during the roll-pressing process by the second roller 22. At this time, for the effective inspection, the pressing force of the second roller 22 may be higher than the pressing force of the first roller 21.

In particular, according to an embodiment of the present disclosure, a coordinate of the separator damage position D may be derived by rolling-pressing the electrode assembly 2 with the second roller 22 in a direction intersecting with the first roller 21.

Figure 5:
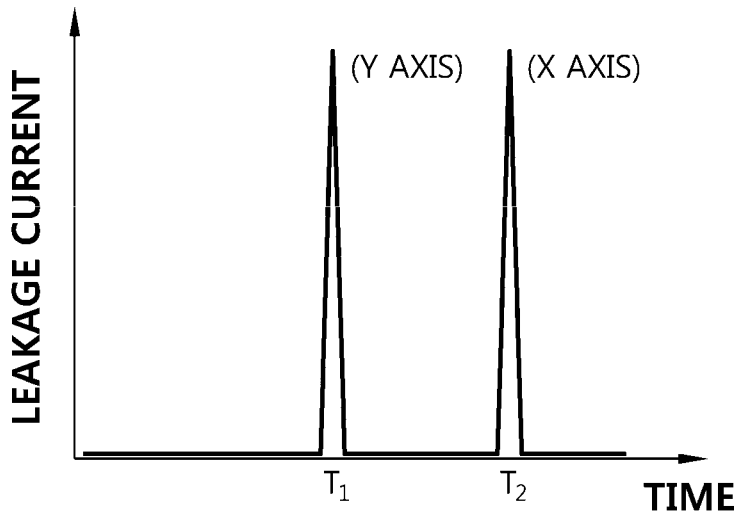
FIG. 5 is a graph exemplarily showing a leakage current according to moving time of a first roller and a second roller of FIGS. 3 and 4.

In other words, the moving speeds of the first roller 21 and the second roller 22 may be set in advance, and the time at which the leakage current is detected during the roll-pressing process may also be measured as shown in FIG. 5. Thus, the separator damage position may be derived using the following equation based on the moving speeds of the first roller 21 and the second roller 22 and the leakage current detection times.

X-axis coordinate of the separator damage: $Xn = V_1 \times T_2$   1:

Y-axis coordinate of the separator damage: $Yn = V_2 \times T_1$   2:

($V_1$: a moving speed of the first roller 21, $T_2$: a leakage current detection time when the first roller 21 is used, $V_2$: a moving speed of the second roller 22, $T_1$: a leakage current detection time when the second roller 22 is used, X-axis origin: a roll-pressing start point of the first roller 21, Y-axis origin: a roll-pressing start point of second roller 22)

In addition, the separator damage detecting apparatus 1 according to the present disclosure may further include a defect position calculating unit 30 for calculating the separator damage position D of at least one site.

The defect position calculating unit 30 may play a role of receiving the moving speeds of the first and second rollers 21, 22 and the leakage current detection times from the first and second rollers 21, 22 and the short circuit measuring unit 10, calculating the separator damage position D using the above equation, and displaying on a display to be observed by a user.

If the defect position calculating unit 30 is used, even though the information value is increased due to a lot of separator damages, the damage position may be visually identified quickly and quickly by calculating and displaying the damage position accurately and quickly.

Figure 6:
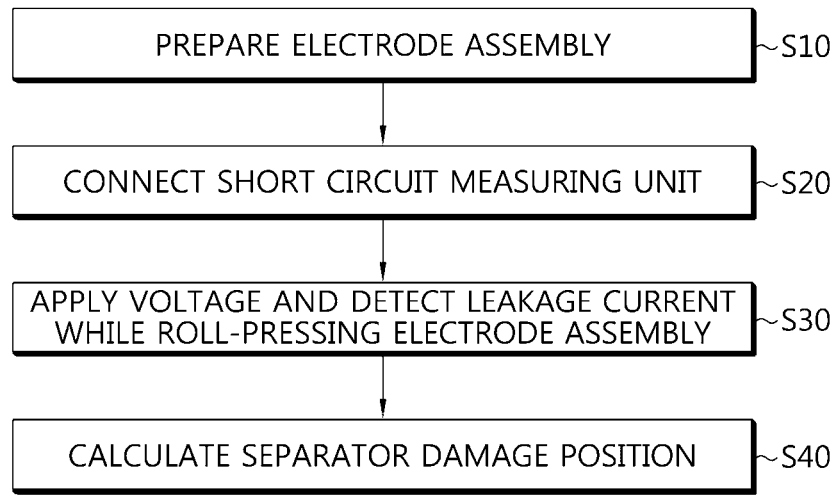
FIG. 6 is a flowchart for illustrating processes for performing a separator damage detecting method according to an embodiment of the present disclosure.

Hereinafter, a separator damage detecting method will be described in brief with reference to FIG. 6 along with FIGS. 2 to 5.

First, an electrode assembly 2 serving as an inspection target is loaded on the worktable 23 located in an inspection chamber (S10).

After that, the +pin 12a and the −pin 12b of the short circuit measuring unit 10 are connected to the positive electrode tab 3a of the positive electrode plate and the negative electrode tab 5a of the negative electrode plate, respectively (S20). At this time, as shown in FIG. 2, the +pin 12a and the −pin 12b may electrically contact all of the positive electrode tabs 3a and the negative electrode tabs 5a by integrally pressing the plurality of positive electrode tab 3a and the plurality of negative electrode tab 5a stacked in a rod shape in a vertical direction.

After that, a preset voltage is applied, and the upper surface of the electrode assembly 2 is roll-pressed in a horizontal direction by using the first roller 21. If no leakage current over a certain value is detected during the roll-pressing process by the first roller 21, the separator of the corresponding electrode assembly 2 is determined as a good separator, and if a leakage current over a certain value is detected, the separator of the electrode assembly 2 is determined as a defective separator that is damaged (S30). In addition, when determining a separator defect, the moving speed of the first roller 21 and the leakage current detection time may be stored in the defect position calculating unit 30.

After that, the separator damage may be further inspected using the second roller 22 in a case where the separator is determined as being defective in the first inspection and it is intended to correctly determine a damage position of the separator, where there is an error in the inspection due to an insufficient roll-pressing force of the first roller 21 even if the separator is determined as being good in the first inspection, or where additional inspection is required due to any reason. Thus, if the separator is determined as being good in the first inspection and there is no special reason for additional inspection, the second inspection using the second roller 22 may be omitted.

However, if it is necessary to accurately identify the separator damage position as described above, the second roller 22 is used to roll-press the upper surface of the electrode assembly 2 in the vertical direction. At this time, the moving speed of the second roller 22 and the leakage current detection time according to the roll-pressing of the second roller 22 are stored in the defect position calculating unit 30.

After that, the number and positions of damaged separator sites may be calculated based on the moving speeds of the first roller 21 and the second roller 22 and the leakage current detection time by the defect position calculating unit 30 and displayed on the display (not shown) (S40).

According to this embodiment having the configuration and operation as described above, it is possible to induce a temporary short circuit of the separator damage portion just at a low voltage and effectively detect a separator damage by uniformly increasing the pressure applied to each unit cell area with the same pressing force compared to the conventional jig using a surface pressing method Further, the separator damage position may be calculated accurately using the moving speed of the roller and the leakage current detection time in detecting a separator defect.

If the frequency of separator damage positions is identified as above, it is possible to estimate a process and a cause by which the separator is damaged, and the cause of the defect may be eliminated by effectively improving the process and cause.

For example, if the damage frequency of the separator is observed high in an edge or corner region, it is possible to estimate that there is a problem at a gripper (not shown) used to fold the bi-cell and repair or replace the gripper. For a folding work, the gripper holes the edge of the bi-cell and folds the bi-cell, and the stress of the gripper or foreign matters separated from the gripper is likely to cause separator tearing or damage.

Figure 7:
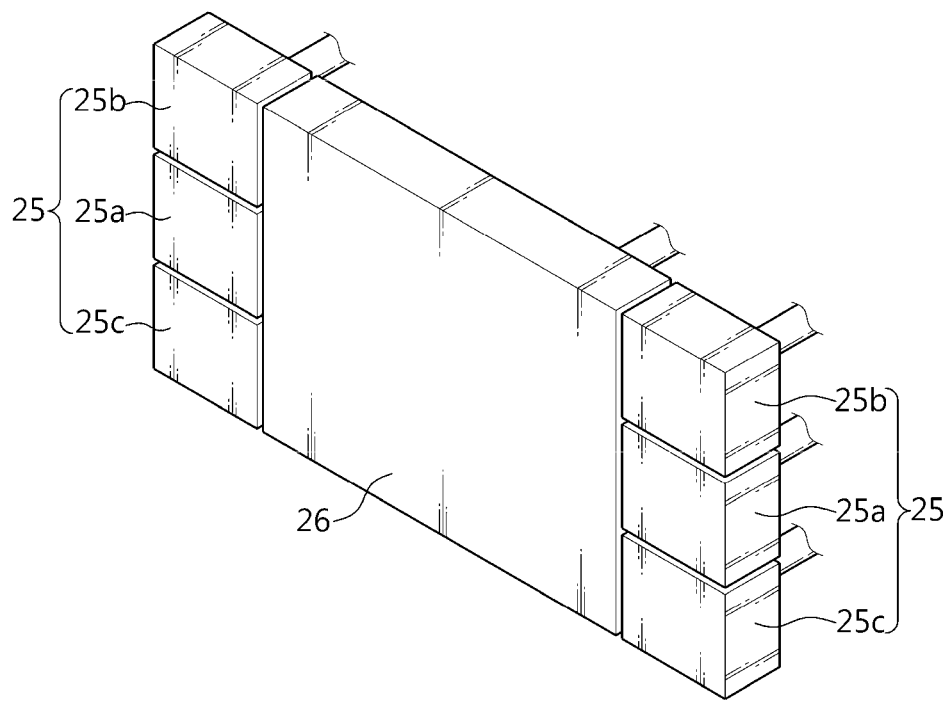
FIG. 7 is a perspective view schematically showing a pressing jig according to another embodiment of the present disclosure.
Figure 8:
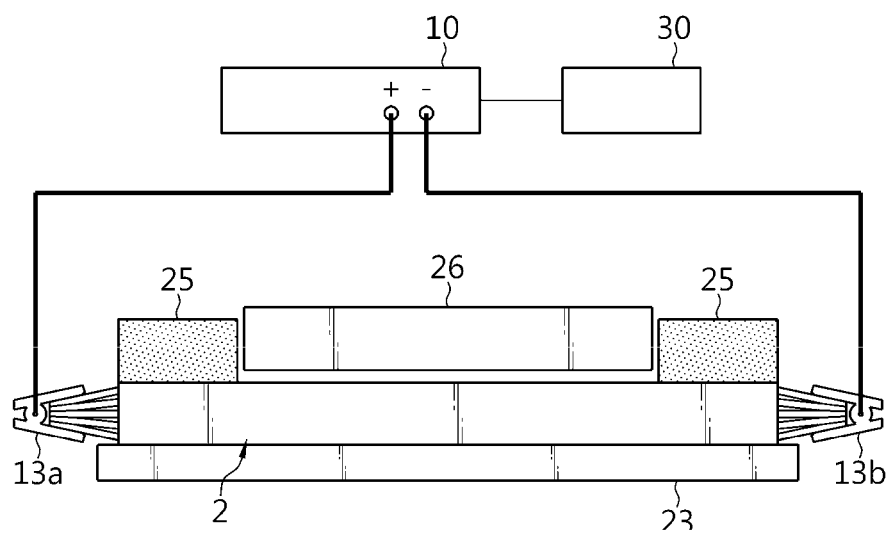
FIGS. 8 and 9 are diagrams for illustrating a separator damage detecting process using the pressing jig of FIG. 7.
Figure 9:
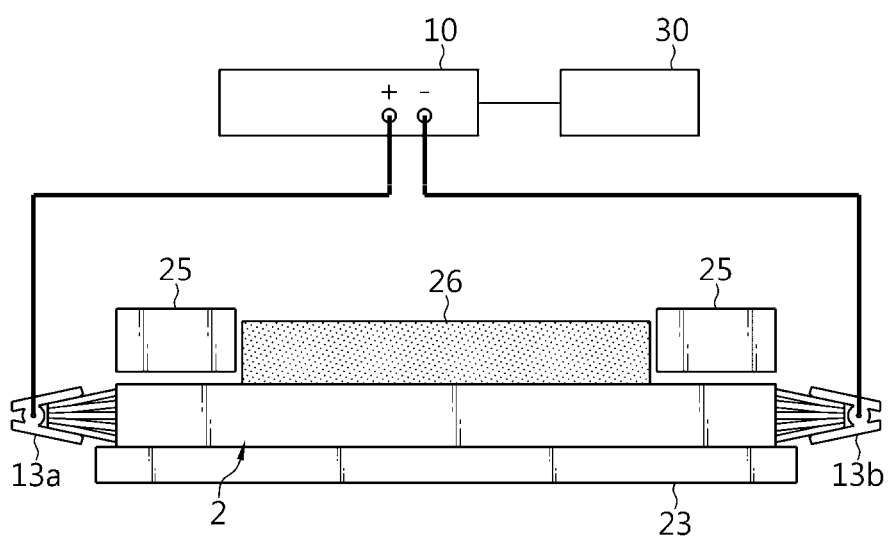

FIG. 7 is a perspective view schematically showing a pressing jig 20 according to another embodiment of the present disclosure, and FIGS. 8 and 9 are diagrams for illustrating a separator damage detecting process using the pressing jig 20 of FIG. 7.

Hereinafter, a separator damage detecting apparatus 1 according to another embodiment of the present disclosure will be described with reference to these figures. The same member number as in the former embodiment denotes the same component, and the same component will not be described in detail, while features different from the former embodiment will be described in detail.

The pressing jig 20 according to this embodiment is provided to consecutively press predesignated regions of at least one surface of the electrode assembly 2. That is, the pressing jig 20 of the former embodiment includes a roller for roll-pressing the electrode assembly 2, whereas the pressing jig 20 of this embodiment may include a plurality of partial pressing plates 25, 26, which are separated per region and independently driven, as shown in FIG. 7. In addition, as in this embodiment, the +pin 13a and the −pin 13b of the short circuit measuring unit 10 may be replaced into a pincers type for stable contact with the plurality of electrode tabs.

The plurality of partial pressing plates 25, 26 operate to consecutively or selectively press different regions of at least one surface of electrode assembly 2, for example both edge regions and a central region of the electrode assembly 2, in a direction orthogonal to one surface of electrode assembly 2.

More specifically, the plurality of partial pressing plates 25, 26 may include edge pressing plates 25 corresponding to both edge regions of the electrode assembly 2 and a center pressing plate 26 corresponding to the central region of the electrode assembly 2. In addition, the edge pressing plates 25 may include a first edge pressing plate 25a corresponding to a center portion of the separator edge, and second edge pressing plates 25b, 25c corresponding to corner portions of the separator edge.

The edge pressing plates 25 may partially press the edges and the corner areas of the electrode assembly 2 when inspecting for a separator damage, and the center pressing plate 26 may partially press the broad center region of the electrode assembly 2 independently from the edge pressing plates 25.

According to the configuration and operation of the pressing jig 20 of this embodiment, for example, as shown in FIG. 8, if a leakage current is detected in a state where a voltage is applied and the edge pressing plates 25 are operated, it is possible to determine the occurrence of a separator damage and its damage position at the same time.

Considering that the possibility of separator damage is generally higher at the edge than the center, the first inspection may be performed by pressing the edge regions of the electrode assembly 2 by the edge pressing plates 25 and applying a voltage. If there is no problem after the first inspection, as in FIG. 9, the second inspection may be performed by releasing the pressure to the electrode assembly 2 by the edge pressing plates 25 and operating the center pressing plate 26 to press the center region of the electrode assembly 2 and applying a voltage.

In this embodiment, the edge pressing plate 25 may also be configured such that the first edge pressing plate 25a and the second edge pressing plate 25b, 25c are driven separately, which allows the separator damage position to be identified more accurately at the edge portions of the separator.

In addition, in this embodiment, since the pressing plates are separated into several pieces, the pressure applied to each unit cell area may be increased with the same driving force as compared to the conventional technique using one pressing plate corresponding to the entire area of the cell. Thus, it may be easier to induce a temporary short circuit of the separator damage portion.

Meanwhile, in this embodiment, the defect position calculating unit 30 may be configured to receive the selective operation information of the plurality of partial pressing plates 25, 26 and the leakage current occurrence information from the short circuit measuring unit 10 and the pressing jig 20 and display the separator damage position corresponding to the partial pressing plates 25, 26 used for detecting the leakage current on the display.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, when the terms indicating up, down, left and right directions are used in the specification, it is obvious to those skilled in the art that these merely represent relative locations for convenience in explanation and may vary based on a location of an observer or an object to be observed.

What is claimed is:

1. A separator damage detecting apparatus, which detects a damage to a separator of a secondary battery comprising:
    a pressing jig configured to roll-press at least one surface of an electrode assembly of the secondary battery having a structure in which a positive electrode plate, the separator and a negative electrode plate are stacked to induce a temporary short circuit of the positive electrode plate and the negative electrode plate, and
    a short circuit measuring unit configured to apply a voltage to the electrode assembly, and to detect a leakage current generated by the short circuit,
    wherein the pressing jig includes:
        a first roller that roll-presses the at least one surface of the electrode assembly from one edge of the electrode assembly to an opposite edge of the electrode assembly in a horizontal direction; and
        a second roller that roll-presses the at least one surface of the electrode assembly from one edge of the electrode assembly to an opposite edge of the electrode assembly in a direction vertical to the rolling direction of the first roller, and
    the short circuit measuring unit comprises an insulation resistance meter or a Hi-Pot test device.

2. The separator damage detecting apparatus according to claim 1, wherein the first and second rollers roll-press on the same surface of the electrode assembly.

3. The separator damage detecting apparatus according to claim 1, wherein the first and second rollers roll-press with a uniform pressure.

4. The separator damage detecting apparatus according to claim 1, wherein the first roller has a length corresponding to a width of the electrode assembly.

5. The separator damage detecting apparatus according to claim 1, wherein the second roller has a length corresponding to a length of the electrode assembly.

6. A separator damage detecting apparatus, which detects a damage to a separator of a secondary battery comprising:
    a pressing jig configured to consecutively press predetermined regions of one surface of an electrode assembly of the secondary battery having a structure in which a positive electrode plate, the separator and a negative electrode plate are stacked to induce a temporary short circuit of the positive electrode plate and the negative electrode plate,
    wherein the pressing jig includes a plurality of partial pressing plates that are located on the one surface of the electrode assembly and configured to independently press different regions of the one surface of the electrode assembly in a direction orthogonal to the one surface of the electrode assembly, and the plurality of partial pressing plates consecutively or selectively press two side edge regions and a central region of the electrode assembly, and
    wherein the plurality of partial pressing plates include a plurality of edge pressing plates located on each of the side edge regions of the electrode assembly and a center pressing plate located on the central region of the electrode assembly.

7. The separator damage detecting apparatus according to claim 6,
    wherein the edge pressing plates include:
    a first edge pressing plate located a central portion of the edge region of the electrode assembly; and second edge pressing plates located each a corner portion of the edge region of the electrode assembly.

8. A method for detecting a separator damage of a secondary battery, comprising:
- (a) preparing an electrode assembly having a structure in which a positive electrode plate, a separator and a negative electrode plate are stacked;
- (b) connecting a short circuit measuring unit to the electrode assembly; and
- (c) applying a preset voltage to the electrode assembly and detecting a leakage current while pressing at least one surface of the electrode assembly,
- wherein in the step (c),
- the at least one surface of the electrode assembly is roll-pressed using a first roller and a second roller, and
- the first roller that roll-presses the at least one surface of the electrode assembly from one edge of the electrode assembly to an opposite edge of the electrode assembly in a horizontal direction; and
- the second roller that roll-presses the at least one surface of the electrode assembly from one edge of the electrode assembly to an opposite edge of the electrode assembly in a direction vertical to the rolling direction of the first roller, and
- the short circuit measuring unit comprises an insulation resistance meter or a Hi-Pot test device.

9. The method for detecting a separator damage of a secondary battery according to claim 8, further comprising:
- (d) calculating a separator damage position based on a moving speed of the first and second rollers and a leakage current detection time detected by the short circuit measuring unit, when the electrode assembly is roll-pressed two times with the first and second rollers.

10. A method for detecting a separator damage of a secondary battery, comprising:
- (a) preparing an electrode assembly having a structure in which a positive electrode plate, a separator and a negative electrode plate are stacked;
- (b) connecting a short circuit measuring unit to the electrode assembly;
- wherein the short circuit measuring unit comprises an insulation resistance meter or a Hi-Pot test device; and
- (c) applying a preset voltage to the electrode assembly and detecting a leakage current while pressing at least one surface of the electrode assembly,
- wherein in the step (c), predesignated regions of the at least one surface of the electrode assembly are consecutively or selectively pressed with a plurality of partial pressing plates located on the same surface of the electrode assembly, wherein the plurality of partial pressing plates configured to independently press different regions of the same surface of the electrode assembly in a direction orthogonal to the same surface of the electrode assembly; and
- wherein the plurality of partial pressing plates include a plurality of edge pressing plates located on each of two side edge regions of the electrode assembly and a center pressing plate located on a central region of the electrode assembly.

11. The method according to claim 10, wherein the edge pressing plates include:
- a first edge pressing plate located a central portion of the edge region of the electrode assembly; and
- second edge pressing plates located each a corner portion of the edge region of the electrode assembly.

* * * * *